US012009456B2

United States Patent
Wu et al.

(10) Patent No.: US 12,009,456 B2
(45) Date of Patent: Jun. 11, 2024

(54) LIGHT-EMITTING DIODE STRUCTURE AND MANUFACTURING METHOD THEREOF

(71) Applicant: PlayNitride Display Co., Ltd., MiaoLi County (TW)

(72) Inventors: Bo-Wei Wu, MiaoLi County (TW); Yu-Yun Lo, MiaoLi County (TW); Shiang-Ning Yang, MiaoLi County (TW); Chang-Feng Tsai, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 133 days.

(21) Appl. No.: 17/520,628

(22) Filed: Nov. 6, 2021

(65) Prior Publication Data

US 2023/0083176 A1 Mar. 16, 2023

(30) Foreign Application Priority Data

Sep. 13, 2021 (TW) ................................. 110133941

(51) Int. Cl.
  *H01L 33/00* (2010.01)
  *H01L 33/22* (2010.01)
  *H01L 33/32* (2010.01)
(52) U.S. Cl.
  CPC .......... *H01L 33/22* (2013.01); *H01L 33/0093* (2020.05); *H01L 33/0095* (2013.01); *H01L 33/32* (2013.01)
(58) Field of Classification Search
  None
  See application file for complete search history.

(56) References Cited

U.S. PATENT DOCUMENTS

| 9,000,466 | B1 | 4/2015 | Aldaz et al. |
| 2003/0003690 | A1* | 1/2003 | Nering .................. B23K 26/40 |
| | | | 257/E21.599 |
| 2009/0079025 | A1 | 3/2009 | Yamazaki |

FOREIGN PATENT DOCUMENTS

| CN | 101305478 | 11/2008 |
| CN | 102891221 | 1/2013 |
| CN | 103515489 | 1/2014 |
| CN | 110291627 | 9/2019 |
| KR | 20120133834 | 12/2012 |
| TW | 201939608 | 10/2019 |

OTHER PUBLICATIONS

"Office Action of Taiwan Counterpart Application", dated Apr. 22, 2022, p. 1-p. 9.
"Office Action of China Counterpart Application", issued on Apr. 1, 2024, p. 1-p. 9.

* cited by examiner

*Primary Examiner* — Bradley Smith
(74) *Attorney, Agent, or Firm* — JCIPRNET

(57) ABSTRACT

A light-emitting diode structure including a semiconductor stack layer is provided. The semiconductor stack layer includes a first type semiconductor layer, an active layer, and a second type semiconductor layer. The active layer is disposed on the first type semiconductor layer. The second type semiconductor layer is disposed on the active layer. A side wall at any side of the semiconductor stack layer includes a rough surface. A manufacturing method of a light-emitting diode structure is also provided.

12 Claims, 13 Drawing Sheets

LIGHT-EMITTING DIODE STRUCTURE AND MANUFACTURING METHOD THEREOF

CROSS-REFERENCE TO RELATED APPLICATION

This application claims the priority benefit of Taiwanese application no. 110133941, filed on Sep. 13, 2021. The entirety of the above-mentioned patent application is hereby incorporated by reference herein and made a part of this specification.

BACKGROUND

Technical Field

The disclosure relates to an optoelectronic component and a manufacturing method thereof. Particularly, the disclosure relates to a light-emitting diode structure and a manufacturing method thereof.

Description of Related Art

In a general manufacturing process of a light-emitting diode, an epitaxial layer is etched into a plurality of light-emitting diode structures independent of each other by a photolithography and etching process. However, in the photolithography and etching process (e.g., a dry etching process), a lattice defect may be generated on a side wall of a semiconductor stack layer of the light-emitting diode, resulting in recombination between electrons and electron holes at the defective part and causing edge current leakage, that is, generating the so-called side wall effect, during the use of the light-emitting diode.

As the light-emitting diode chip has a relatively large size, the side wall effect does not have a great influence on the luminous efficiency, which is because of a relatively small ratio of the side wall area to the light-emitting layer area of the light-emitting diode chip in this case. However, for a micro-light-emitting diode (micro-LED) chip, since the light-emitting layer area is greatly reduced, the ratio of the side wall area to the light-emitting layer area of the micro-light-emitting diode chip may become relatively great. In such case, the side wall effect may become significant, which greatly affects the luminous efficiency of the micro-light-emitting diode chip.

SUMMARY

The disclosure provides a light-emitting diode structure, whose luminous efficiency is increased.

The disclosure provides a manufacturing method of a light-emitting diode structure, which effectively increases luminous efficiency of a light-emitting diode structure.

An embodiment of the disclosure provides a light-emitting diode structure including a semiconductor stack layer. The semiconductor stack layer includes a first type semiconductor layer, an active layer, and a second type semiconductor layer. The active layer is disposed on the first type semiconductor layer. The second type semiconductor layer is disposed on the active layer. A side wall at any side of the semiconductor stack layer includes a rough surface.

The side wall of the semiconductor stack layer has a plurality of inclined edges on a longitudinal section perpendicular to the active layer. An absolute value of a slope of each of the inclined edges relative to the active layer is less than 1.8. The inclined edges have a plurality of different slopes.

An embodiment of the disclosure provides a manufacturing method of a light-emitting diode structure. The method includes the following. A semiconductor stack layer is grown on a first substrate. The semiconductor stack layer is divided into a first portion and a second portion. The semiconductor stack layer includes a first type semiconductor layer, an active layer, and a second type semiconductor layer sequentially grown on the first substrate. A force applying means is provided to physically break the first portion and the second portion apart from each other. The first portion includes a plurality of light-emitting diode structures separated from each other.

In the light-emitting diode structure of the embodiments of the disclosure, the side wall at any side of the semiconductor stack layer includes a rough surface. In other words, the side wall includes a portion that is not generated by etching. That is, the rough surface is generated from breaking the semiconductor stack layer apart. Accordingly, the side wall effect caused by etching can be effectively prevented, so the luminous efficiency and brightness of the light-emitting diode structure can be effectively increased. In the manufacturing method of a light-emitting diode structure of the embodiments of the disclosure, a force applying means is used to physically break the first portion and the second portion of the semiconductor stack layer apart from each other. The first portion includes the plurality of light-emitting diode structures separated from each other. Therefore, the side wall of the light-emitting diode structure includes a portion that is not generated by etching, that is, a portion that is generated from breaking apart. Accordingly, the side wall effect caused by etching can be effectively prevented, so the luminous efficiency and brightness of the light-emitting diode structure can be effectively increased.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
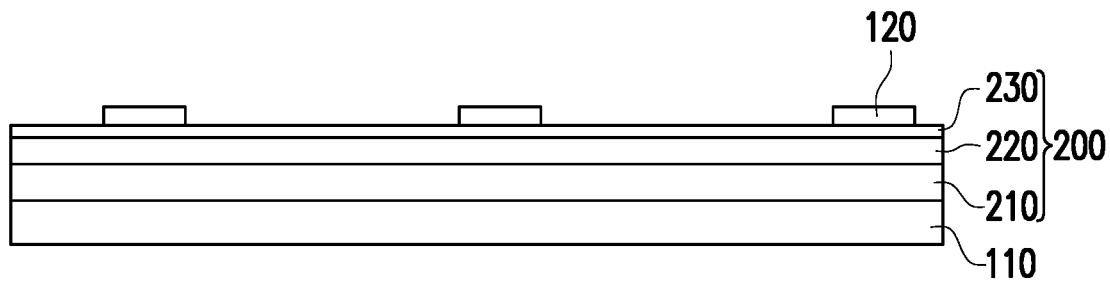
FIG. 1A to FIG. 1D are schematic cross-sectional views illustrating a manufacturing method of a light-emitting diode structure according to an embodiment of the disclosure.

FIG. 1A to FIG. 1D are schematic cross-sectional views illustrating a manufacturing method of a light-emitting diode structure according to an embodiment of the disclosure. With reference to FIG. 1A to FIG. 1D, the manufacturing method of a light-emitting diode structure of this embodiment includes the following. First, with reference to FIG. 1A, a semiconductor stack layer 200 is grown on a first substrate 110. The semiconductor stack layer 200 includes a first type semiconductor layer 210, an active layer 220, and a second type semiconductor layer 230 sequentially grown on the first substrate 110. In this embodiment, the first type semiconductor layer 210 is, for example, an N-type semiconductor layer, and the second type semiconductor layer 230 is, for example, a P-type semiconductor layer. However, in other embodiments, it is also possible that the first type semiconductor layer 210 is a P-type semiconductor layer, and the second type semiconductor layer 230 is an N-type semiconductor layer. The active layer 220 is a light-emitting layer, and is, for example, a quantum well layer or a multiple quantum well layer. In addition, an electrode 120 may also be formed on the second type semiconductor layer 230.

The first type semiconductor layer 210, the active layer 220, and the second type semiconductor layer 230 may be a gallium nitride-based semiconductor material, a gallium arsenide-based semiconductor material, or other suitable semiconductor layer materials. The corresponding materials are selected depending on the requirements of the light-emitting wavelength of the active layer 220. The first substrate 110 may be a sapphire substrate, a gallium nitride substrate, a gallium arsenide substrate, or a substrate of other suitable materials.

Figure 1B:
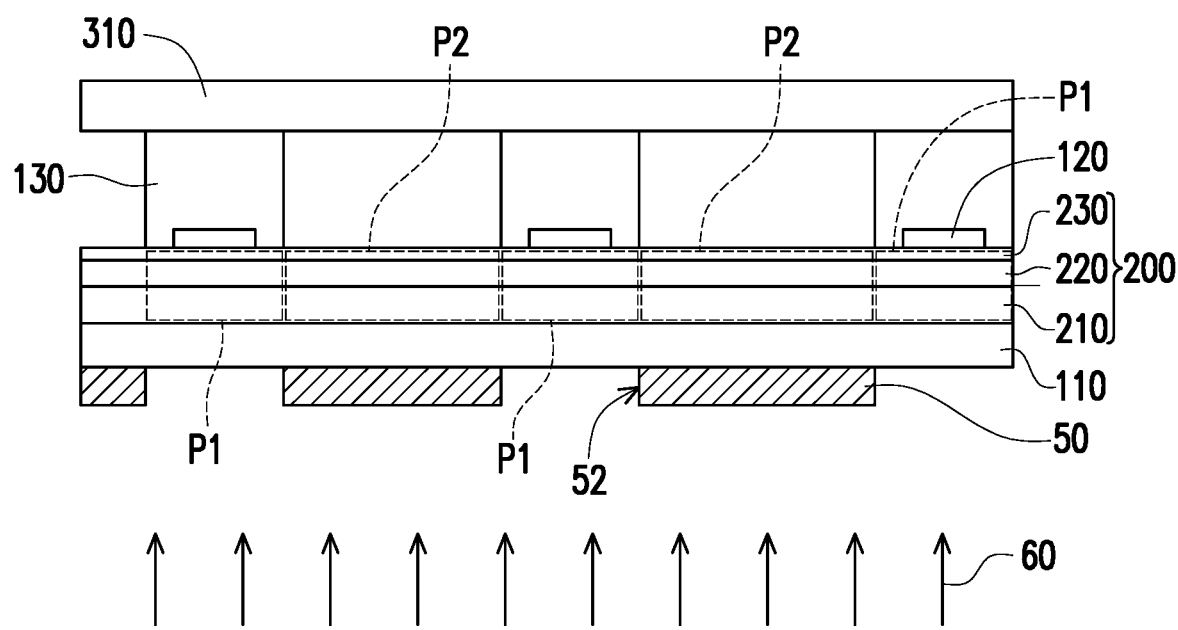
Figure 1C:
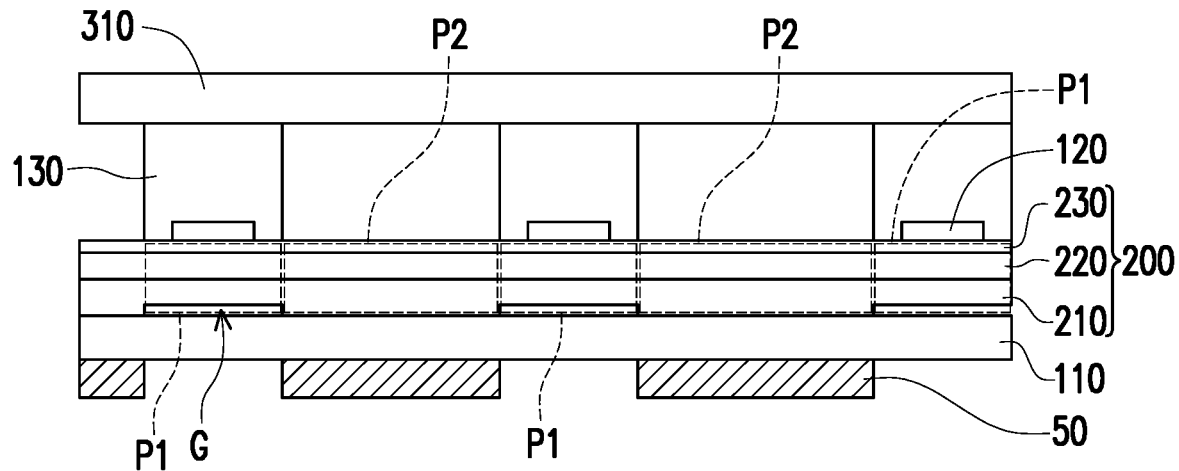

Next, in this embodiment, with reference to FIG. 1B, the semiconductor stack layer 200 is divided into a first portion P1 and a second portion P2. The first portion P1 or the second portion P2 (the first portion P1 as an example in FIG. 1B) of the semiconductor stack layer 200 is adhered onto a second substrate 310 by using a patterned adhesive material 130, such that the semiconductor stack layer 200 is located between the first substrate 110 and the second substrate 310. Then, a patterned mask layer 50 is formed under the second portion P2 of the semiconductor stack layer 200, and the boundary between the first portion P1 and the first substrate 110 is irradiated by a laser 60 through an opening 52 of the patterned mask layer 50 to reduce the binding force between the first portion P1 and the first substrate 110, that is, a laser lift-off process is performed, to form a gap G at the boundary between the first portion P1 and the first substrate 110, as shown in FIG. 1C.

Figure 1D:
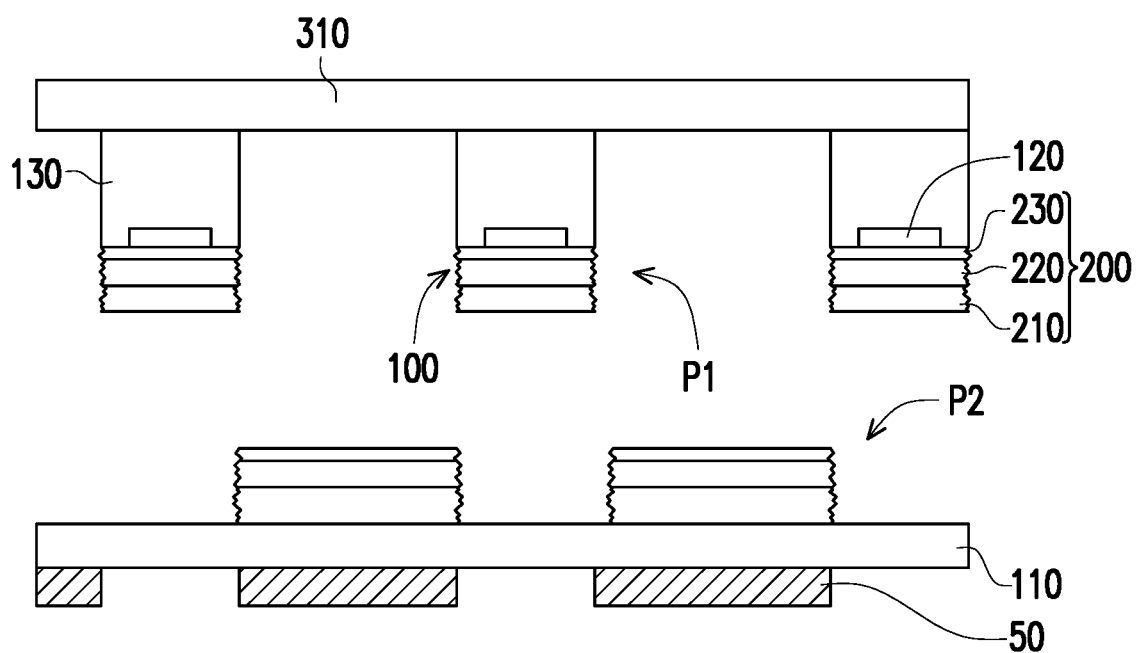

After that, with reference to FIG. 1D, since the binding force between the first portion P1 and the first substrate 110 is reduced or the first portion P1 and the first substrate 110 are completely separated, and the contact area between the first portion P1 and the second portion P2 is less than the longitudinal section area of the second portion P2, a force applying means (e.g., a pulling force or a pressing force) may be provided to be applied to the first portion P1 and the second portion P2. At this time, the stress may be concentrated at the boundary between them to thereby physically break (e.g., by using a pulling force in the example of FIG. 1D) the first portion P1 and the second portion P2 apart from each other. The first portion P1 includes a plurality of light-emitting diode structures 100 separated from each other. In this embodiment, for example, the second substrate 310 is moved relative to the first substrate 110 in a direction away from each other to separate the first portion P1 and the second portion P2.

In the manufacturing process of FIG. 1A to FIG. 1D, a side wall of the light-emitting diode structure 100 is not generated by etching (e.g., dry etching), but instead, a force applying means (a pulling force or a pressing force) is used to break the first portion P1 and the second portion P2 of the semiconductor stack layer 200 apart from each other. Accordingly, the side wall effect caused by etching can be effectively prevented. Therefore, the non-radiative recombination between electrons and electron holes or current leakage in the light-emitting diode structure 100 can be effectively suppressed, so that the luminous efficiency and brightness of the light-emitting diode structure 100 can be effectively increased. In addition, the remaining second portion P2 may also be used in subsequent manufacturing processes to manufacture other light-emitting diode structures, achieving full utilization of materials and reaching the greatest area utilization for the wafer, instead of causing waste of materials as in the etching process. The first portion P1 may be further performed with other manufacturing processes to add an electrode that is electrically connected to the first type semiconductor layer 210 to complete the light-emitting diode device. Moreover, in the above process in which the first portion P1 and the second portion P2 are pattern-defined by utilizing the patterned adhesive material 130, the wafer can be obtained after the first portion P1 and the second portion P2 are broken apart from each other in the subsequent process. Therefore, such a manufacturing process has relatively simplified steps.

Figure 2A:
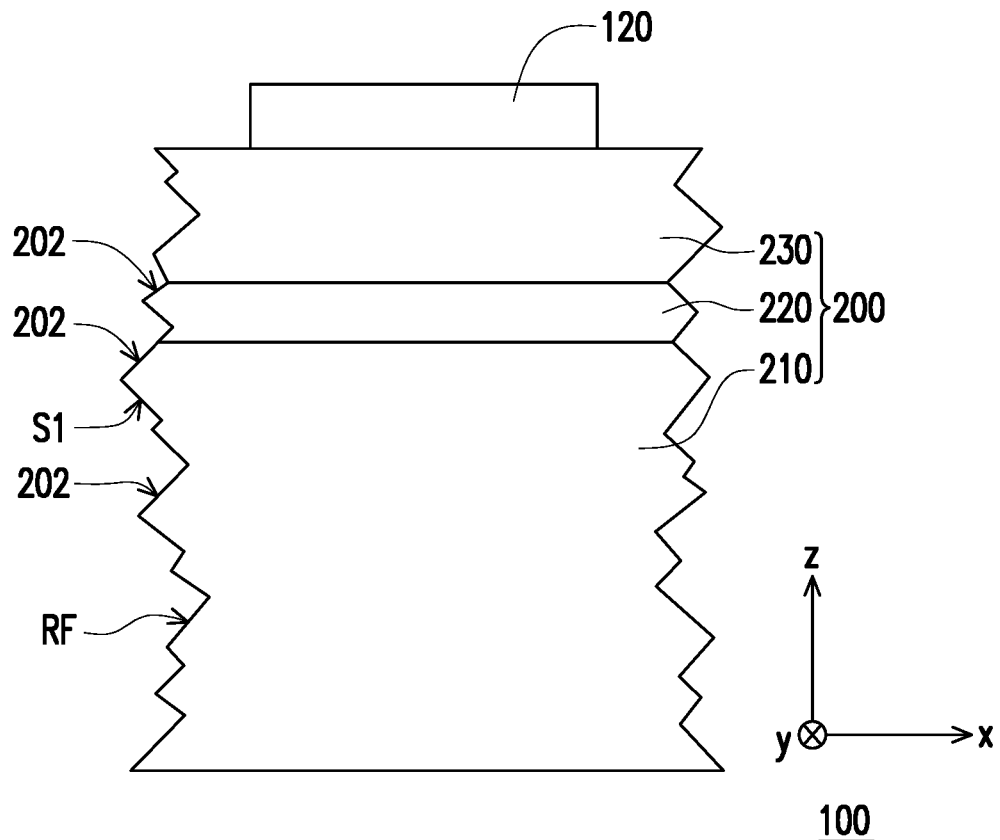
FIG. 2A is a schematic diagram of a light-emitting diode structure manufactured from the steps of FIG. 1A to FIG. 1D.

FIG. 2A is a schematic diagram of a light-emitting diode structure manufactured from the steps of FIG. 1A to FIG. 1D. With reference to FIG. 2A, the light-emitting diode structure 100 of this embodiment is namely the light-emitting diode structure 100 manufactured from the steps of FIG. 1A to FIG. 1D, and includes the semiconductor stack layer 200. The semiconductor stack layer 200 includes the first type semiconductor layer 210, the active layer 220, and the second type semiconductor layer 230. The active layer 220 is disposed on the first type semiconductor layer 210. The second type semiconductor layer 230 is disposed on the active layer 220. A side wall S1 at any side of the semiconductor stack layer 200 includes a rough surface RF, and the side wall S1 is a physical fracture surface. A physical fracture surface refers to a fracture surface not formed by etching, but a fracture surface formed by breaking the first portion P1 and the second portion P2 apart from each other by a force applying means (e.g., a pulling force or a pressing force). For example, the side wall S1 at any side of the semiconductor stack layer 200 has a plurality of inclined edges 202 on a longitudinal section (e.g., the drawing surface of FIG. 2A) perpendicular to the active layer 220. The absolute value of the slope of each of the plurality of inclined edges 202 relative to the active layer 220 is less than 1.8, preferably less than 1.5, and more preferably less than 1.2. The absolute value of the slope of the inclined edge 202 is, for example, a value obtained by dividing the height of the inclined edge 202 in the z direction by the width of the inclined edge 202 in the x direction. In another direction, the absolute value of the slope of the inclined edge 202 is, for example, a value obtained by dividing the height of the inclined edge 202 in the z direction by the width of the inclined edge 202 in the y direction. In this embodiment, the z direction is a direction perpendicular to the active layer 220, and the x direction and the y direction are, for example, two directions parallel to the active layer 220, where the x direction may be perpendicular to the y direction. In addition, the plurality of inclined edges 202 have a plurality of different slopes, and may have a positive slope and a negative slope. The light-emitting diode structure 100 has a characteristic that the plurality of inclined edges 202 fulfill the above conditions, and the plurality of inclined edges 202 are a natural result generated from breaking the first portion P1 and the second portion P2 apart from each other. In other words, the plurality of inclined edges 202 are not generated by etching (e.g., dry etching). In this embodiment, the plurality of inclined edges 202 may have a zigzag shape.

In this embodiment, the maximum width (e.g., the maximum width perpendicular to the z direction) of the active layer of the light-emitting diode structure 100 is less than or equal to 50 micron (μm), for example, 30 μm. That is, the light-emitting diode structure 100 may be a micro-light-emitting diode (micro-LED). In this embodiment, suppression on the side wall effect, in particular, may greatly increase the luminous efficiency and brightness of the micro-light-emitting diode. In the semiconductor stack layer 200 of this embodiment, the root mean square roughness at a portion of the side wall S1 with the plurality of inclined edges 202 may be between 150 nanometers (nm) and 3 μm. In the current micro-light-emitting diode manufacturing process, the boundary of the wafer is mostly defined by patterning etching, and the root mean square roughness of the side wall formed by this manufacturing process is commonly less than 5 nm. That is, by the manufacturing method of a light-emitting diode structure of this embodiment, the side wall S1 of the semiconductor stack layer 200 manufactured thereby has a property of being obviously rougher. In addition, in this embodiment, each lateral section of the semiconductor stack layer 200 is parallel to the active layer 220. Moreover, in this embodiment, the lateral section with the greatest lateral section area is not located at the topmost part or the bottommost part of the semiconductor stack layer 200. The above-mentioned characteristic is a natural result generated from breaking the first portion P1 and the second portion P2 apart from each other.

Figure 1E:
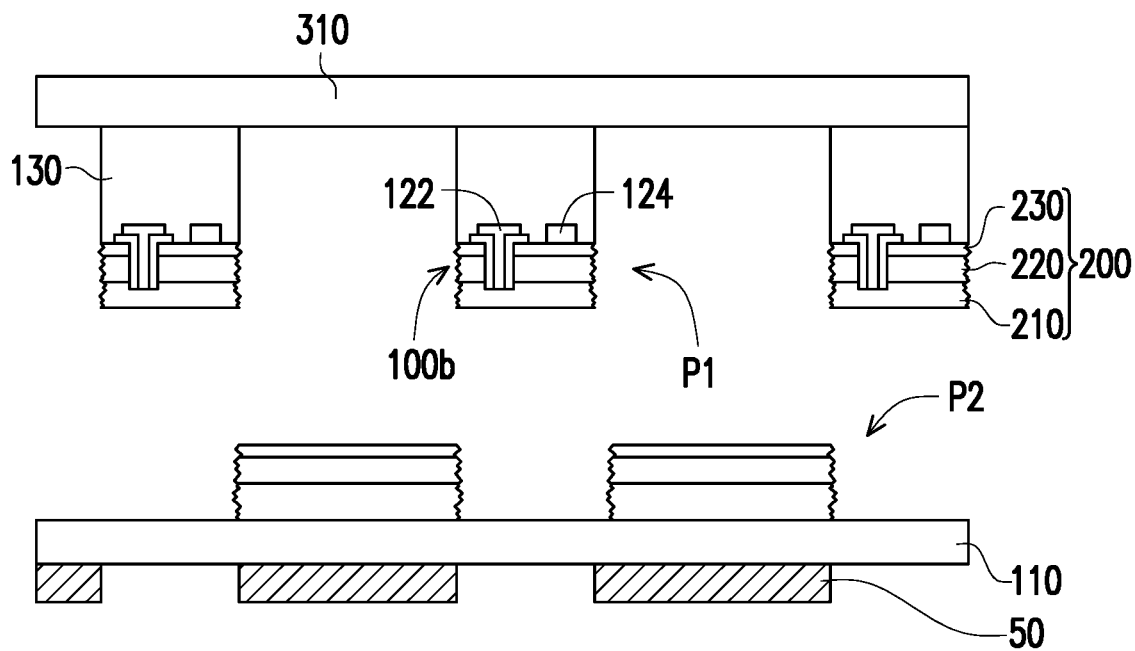
FIG. 1E is another variant embodiment of FIG. 1D.
Figure 2B:
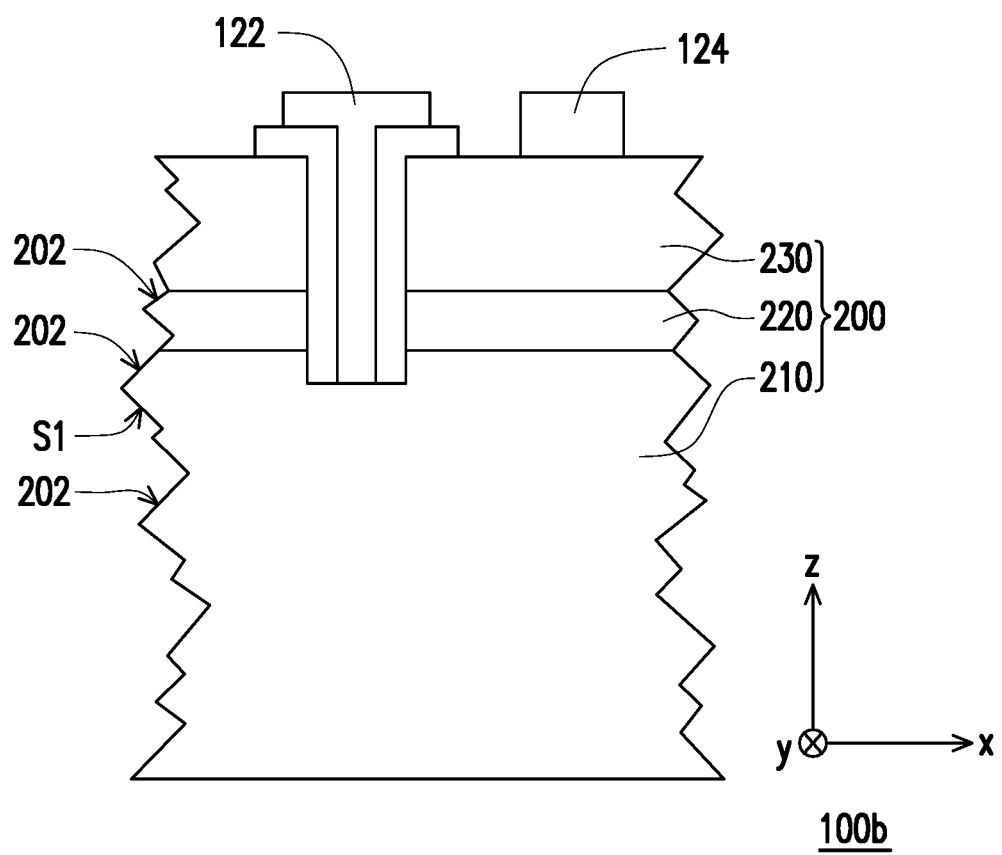
FIG. 2B is a light-emitting diode structure according to another variant embodiment of FIG. 2A.

In FIG. 1D and FIG. 2A, a vertical light-emitting diode is taken as an example of the light-emitting diode structure 100, but the disclosure is not limited thereto. In another embodiment, as shown in FIG. 1E and FIG. 2B, a horizontal light-emitting diode is taken as an example of a light-emitting diode structure 100b. That is, two electrodes 122 and 124 of the light-emitting diode structure 100b are arranged on the same side of the semiconductor stack layer 200. The electrode 122 is electrically connected to the first type semiconductor layer 210, and the electrode 124 is electrically connected to the second type semiconductor layer 230. The light-emitting diode structure 100b may also serve as a flip-chip packaged light-emitting diode in subsequent manufacturing processes.

FIG. 3A to FIG. 3D are schematic cross-sectional views illustrating a manufacturing method of a light-emitting diode structure according to another embodiment of the disclosure. With reference to FIG. 3A to FIG. 3D, the manufacturing method of a light-emitting diode structure of this embodiment is similar to the manufacturing method of a light-emitting diode structure of FIG. 1A to FIG. 1D, and the differences between them are described as follows. In the manufacturing method of a light-emitting diode structure of this embodiment, with reference to FIG. 3A first, before a force applying means (e.g., a pulling force or a pressing force) is used to break the first portion P1 and the second portion P2 of the semiconductor stack layer 200 apart from each other, the first portion P1 or the second portion P2 is etched, such that the longitudinal section area of the first portion P1 and the longitudinal section area of the second portion P2 are different from each other, to form an etched side wall E1 on the semiconductor stack layer 200. For example, at least one of a portion of the first type semiconductor layer 210 and a portion of the second type semiconductor layer 230 of the second portion P2 may first be selectively etched (e.g., a portion of the second type semiconductor layer 230 of the second portion P2 is first selectively etched in FIG. 3A). The selective etching includes, for example, photolithography and etching, and may be dry etching. That is, only the top of the second type semiconductor layer 230 of the second portion P2 is etched by a photomask process, but the first portion P1 is not etched. The etched side wall E1 is located on at least one of the first type semiconductor layer 210 and the second type semiconductor layer 230 (e.g., located on the second type semiconductor layer 230 in FIG. 3A).

Figure 3A:
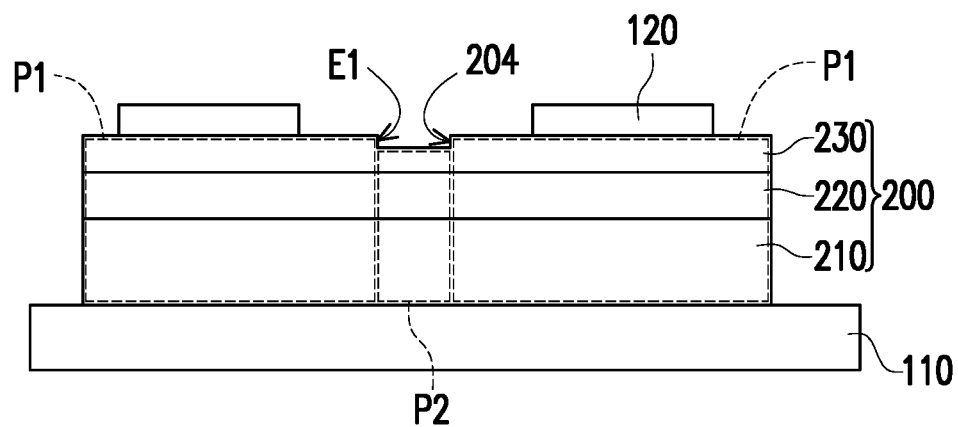
FIG. 3A to FIG. 3D are schematic cross-sectional views illustrating a manufacturing method of a light-emitting diode structure according to another embodiment of the disclosure.

In this embodiment, after at least one of a portion of the first type semiconductor layer 210 and a portion of the second type semiconductor layer 230 of the second portion P2 is selectively etched, the etched side wall E1 is formed on the first portion P1. The etched side wall E1 has a straight edge 204 on the longitudinal section perpendicular to the active layer 220. The absolute value of the slope of the straight edge 204 relative to the active layer 220 is greater than or equal to 3. In FIG. 3A, the absolute value of the slope is, for example, infinity. That is, the straight edge 204 is perpendicular to the active layer 220.

Figure 3B:
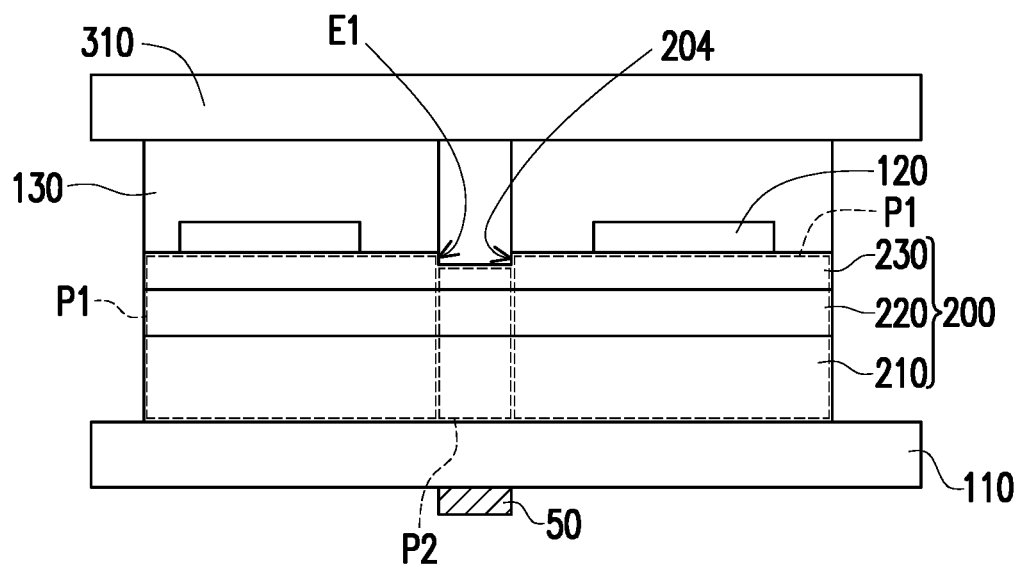

Then, as shown in FIG. 3B, the first portion P1 of the semiconductor stack layer 200 is adhered onto the second substrate 310 with the patterned adhesive material 130, and the patterned mask layer 50 is formed under the second portion P2 of the semiconductor stack layer 200.

Figure 3C:
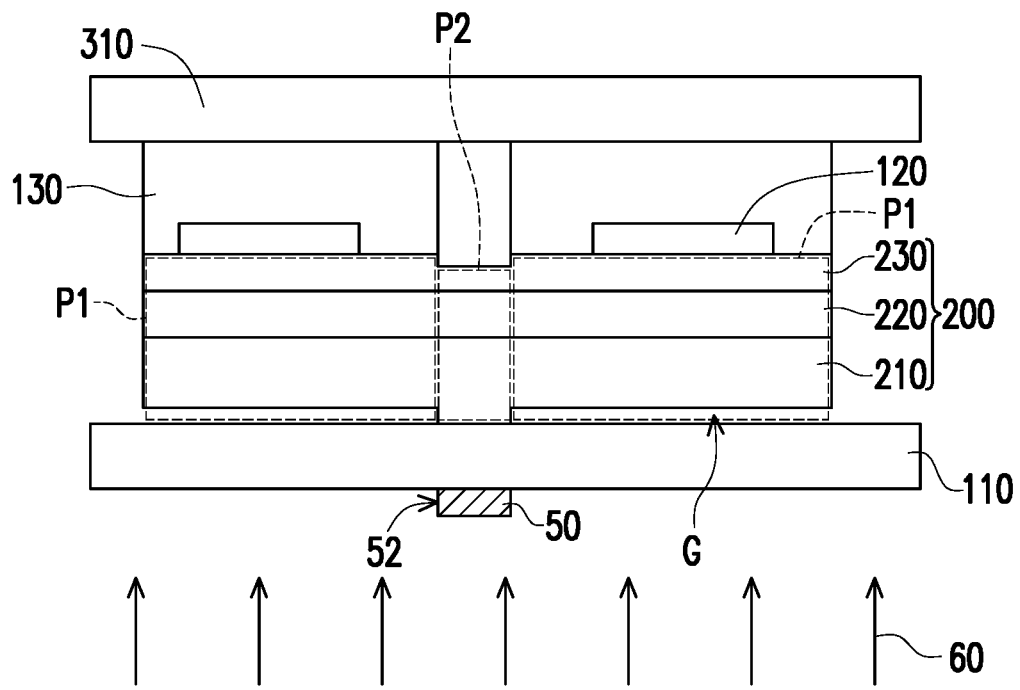

Preferably, as shown in FIG. 3C, the boundary between the first portion P1 and the first substrate 110 may be irradiated by the laser 60 through the opening 52 of the patterned mask layer 50 to reduce the binding force between the first portion P1 and the first substrate 110, that is, a laser lift-off process is performed, to form the gap G at the boundary between the first portion P1 and the first substrate 110, thereby further reducing the contact area between the first portion P1 and the second portion P2.

Figure 3D:
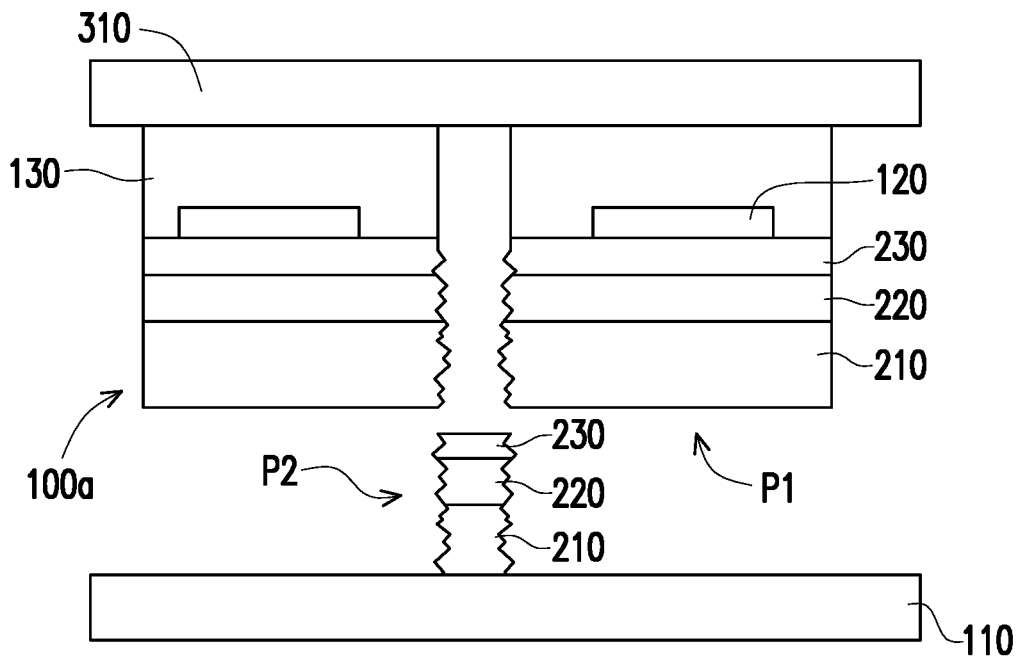

After that, as shown in FIG. 3D, a force applying means (e.g., a pulling force or a pressing force) is used to break (e.g., by using a pulling force in the example of FIG. 3D) the first portion P1 and the second portion P2 of the semiconductor stack layer 200 apart from each other. For example, the second substrate 310 is caused to move relative to the first substrate 110 in a direction away from each other to separate the first portion P1 and the second portion P2. The first portion P1 thus formed includes a plurality of light-emitting diode structures 100a separated from each other.

Figure 4:
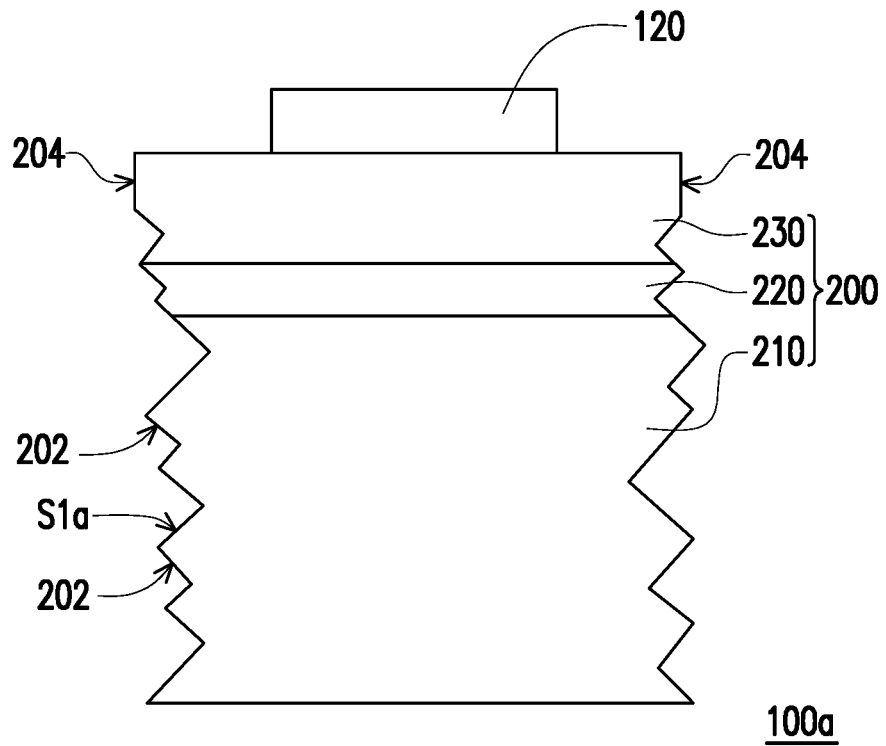
FIG. 4 is a schematic diagram of a light-emitting diode structure manufactured from the steps of FIG. 3A to FIG. 3D.

FIG. 4 is a schematic diagram of a light-emitting diode structure manufactured from the steps of FIG. 3A to FIG. 3D. With reference to FIG. 4, the light-emitting diode structure 100a of this embodiment is namely the light-emitting diode structure 100a manufactured from the steps of FIG. 3A to FIG. 3D. The light-emitting diode structure 100a of this embodiment is similar to the light-emitting diode structure 100 of FIG. 2A, and the differences between them are described as follows. In the light-emitting diode structure 100a of this embodiment, a side wall S1a of the semiconductor stack layer 200 also has the straight edge 204 on a longitudinal section perpendicular to the active layer 220. The absolute value of the slope of the straight edge 204 relative to the active layer 220 is greater than or equal to 3 (e.g., infinity in FIG. 4). In addition, the straight edge 204 is located on at least one of a portion of the side wall of the first type semiconductor layer 210 away from the active layer 220 and a portion of the side wall of the second type semiconductor layer 230 away from the active layer 220 (e.g., the straight edge 204 is located on a portion of the side wall of the second type semiconductor layer 230 away from the active layer 220 as an example in FIG. 4). Moreover, in this embodiment, the plurality of inclined edges 202 are located at least on the side wall of the active layer 220. In other words, the side wall effect mainly occurs on the side wall of the active layer in the conventional etching process, while the plurality of inclined edges 202 of this embodiment are located at least on the side wall of the active layer 220, and thus the side wall of the active layer 220 is still generated from breaking the first portion P1 and the second portion P2 apart from each other, instead of etching. Therefore, the side wall effect can be effectively suppressed. Although the portion of the side wall of the second type semiconductor layer 230 away from the active layer is generated by the etching process, the portion is relatively away from the active layer 220, which does not greatly enhance the side wall effect. Therefore, the semiconductor stack layer 200 still has relatively high luminous efficiency and brightness. Furthermore, since a portion of the second type semiconductor layer 230 of the second portion P2 is etched in advance, it is easier to break the first portion P1 and the second portion P2 of the semiconductor stack layer 200 apart from each other when a force applying means (e.g., a pulling force or a pressing force) is used. In this embodiment, the root mean square roughness of the straight edge 204 is less than the root mean square roughness of the inclined edges 202.

In this embodiment, the side wall at any side at the break of the first portion P1 (that is, the light-emitting diode structure 100a) has the plurality of inclined edges 202 on the longitudinal section perpendicular to the active layer 220. In addition, the absolute value of the slope of each of the plurality of inclined edges 202 relative to the active layer 220 is less than 1.8, preferably less than 1.5, and more preferably less than 1.2. Moreover, the plurality of inclined edges 202 have a plurality of different slopes, and may have, for example, a positive slope and a negative slope. Furthermore, the root mean square roughness of the side wall at the break of the first portion P1 (i.e., the light-emitting diode structure 100a) is between 150 nm and 3 μm.

Figure 5A:
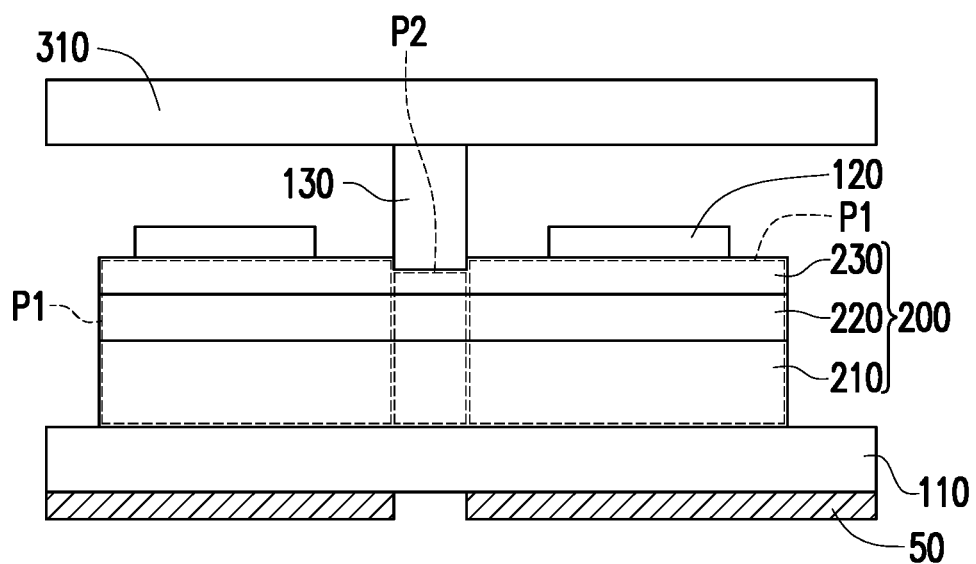
FIG. 5A to FIG. 5C are schematic cross-sectional views illustrating a manufacturing method of a light-emitting diode structure according to yet another embodiment of the disclosure.
Figure 5B:
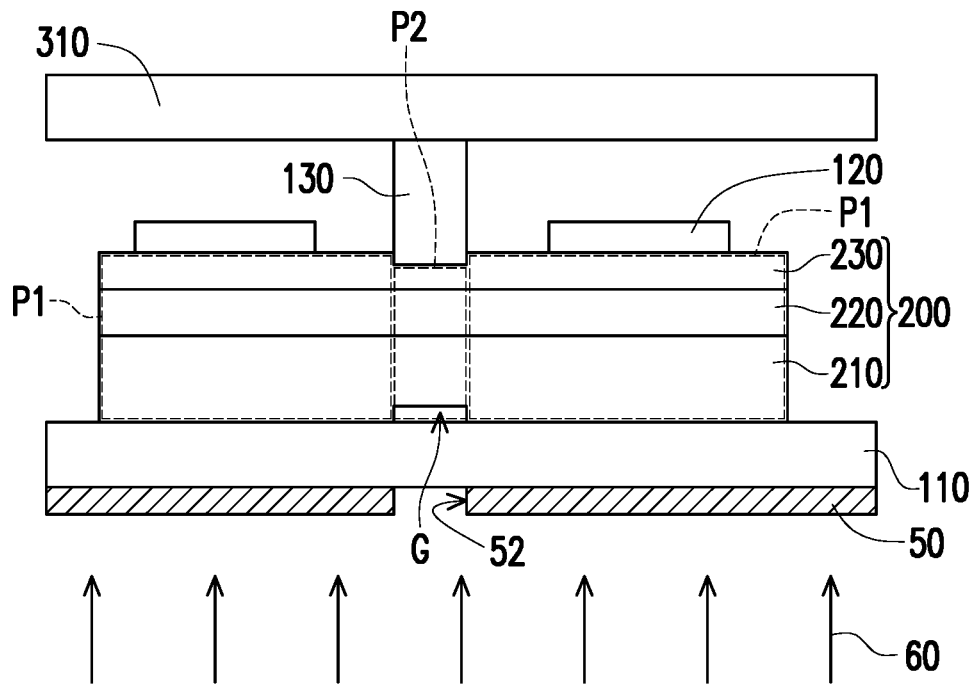
Figure 5C:
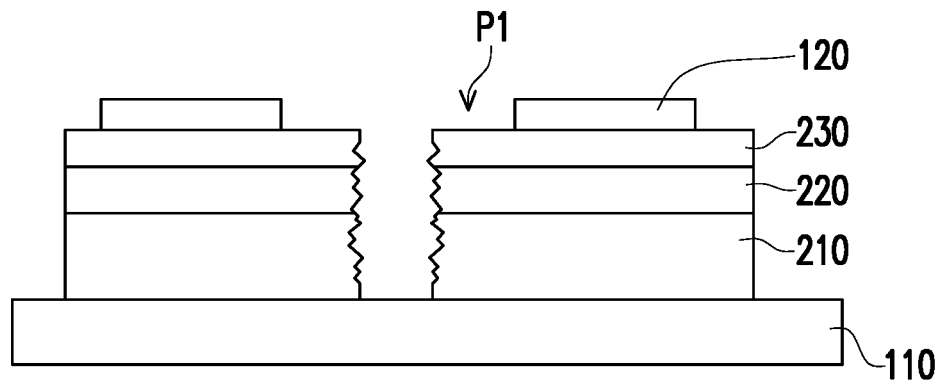

FIG. 5A to FIG. 5C are schematic cross-sectional views illustrating a manufacturing method of a light-emitting diode structure according to yet another embodiment of the disclosure. With reference to FIG. 5A to FIG. 5C, the manufacturing method of a light-emitting diode structure of this embodiment is similar to the manufacturing method of a light-emitting diode structure of 3A to FIG. 3D, and the differences between them are described as follows. With reference to FIG. 5A first, in this embodiment, the second portion P2 is adhered onto the second substrate 310 with patterned adhesive material 130, such that the semiconductor stack layer 200 is located between the first substrate 110 and the second substrate 310. In addition, in this embodiment, the patterned mask layer 50 is formed under the first portion P1 of the semiconductor stack layer 200.

Next, with reference to FIG. 5B, the boundary between the second portion P2 and the first substrate 110 is irradiated by the laser 60 through the opening 52 of the patterned mask layer 50 to reduce the binding force between the second portion P2 and the first substrate 110, that is, a laser lift-off process is performed, to form the gap G at the boundary between the second portion P2 and the first substrate 110.

Then, with reference to FIG. 5C, a force applying means (e.g., a pulling force or a pressing force) is used to break (e.g., by using a pulling force in FIG. 5C) the first portion P1 and the second portion P2 of the semiconductor stack layer 200 apart from each other. For example, the second substrate 310 is caused to move relative to the first substrate 110 in a direction away from each other to separate the first portion P1 and the second portion P2. The first portion P1 thus formed includes the plurality of light-emitting diode structures 100a separated from each other. In this embodiment, the plurality of light-emitting diode structures 100a remain on the first substrate 110.

Figure 6A:
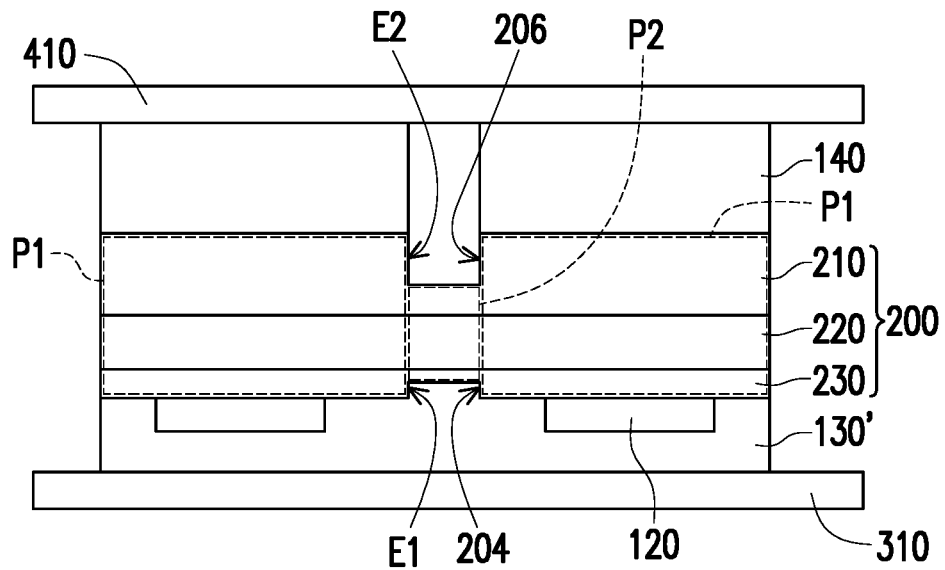
FIG. 6A to FIG. 6B are schematic cross-sectional views illustrating a manufacturing method of a light-emitting diode structure according to still another embodiment of the disclosure.
Figure 6B:
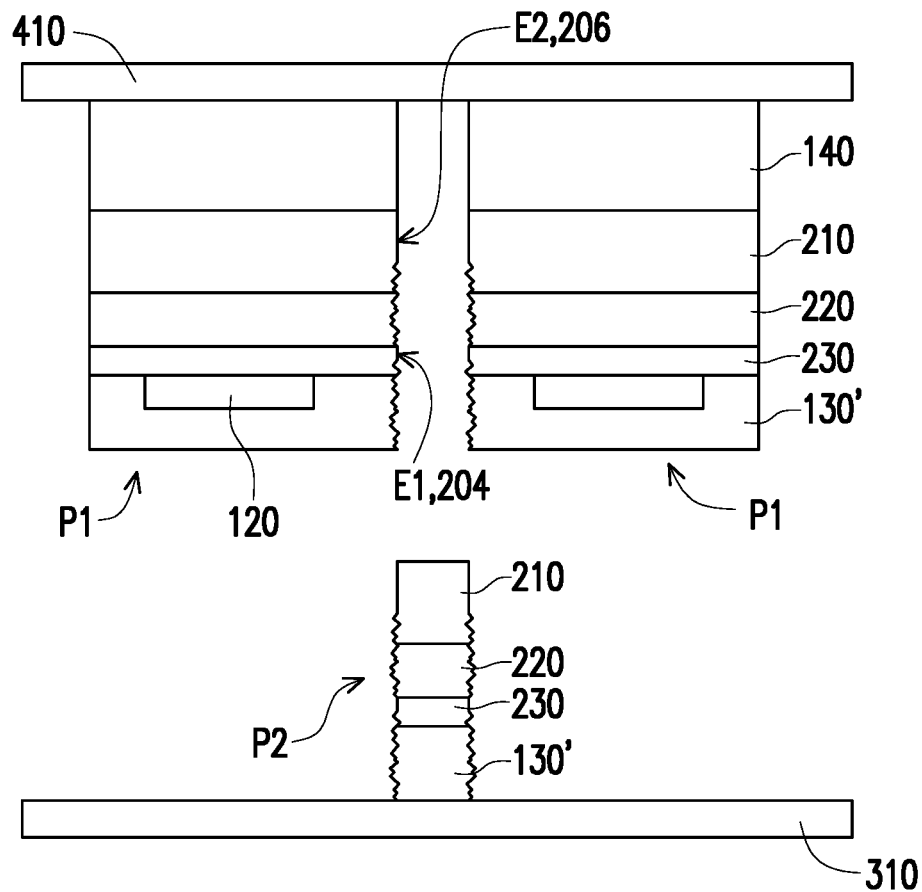

FIG. 6A to FIG. 6B are schematic cross-sectional views illustrating a manufacturing method of a light-emitting diode structure according to still another embodiment of the disclosure. The manufacturing method of a light-emitting diode structure of this embodiment is similar to the manufacturing method of a light-emitting diode structure of FIG. 3A to FIG. 3D, and the differences between them are described as follows. In this embodiment, after a portion of the second type semiconductor layer 230 of the second portion P2 is selectively etched, the first substrate 110 as shown in FIG. 3A is flipped over, the second type semiconductor layer 230 and the electrode 120 are adhered onto the second substrate 310 with an adhesive material 130', and the first substrate 110 is removed. After that, a portion of the first type semiconductor layer 210 of the second portion P2 is selectively etched to form an etched side wall E2 on the first portion P1. The etched side wall E2 has a straight edge 206 on a longitudinal section perpendicular to the active layer 220. The absolute value of the slope of the straight edge 206 relative to the active layer 220 is greater than or equal to 3. In FIG. 6A, the absolute value of the slope is, for example, infinity. That is, the straight edge 206 is perpendicular to the active layer 220.

Figure 7:
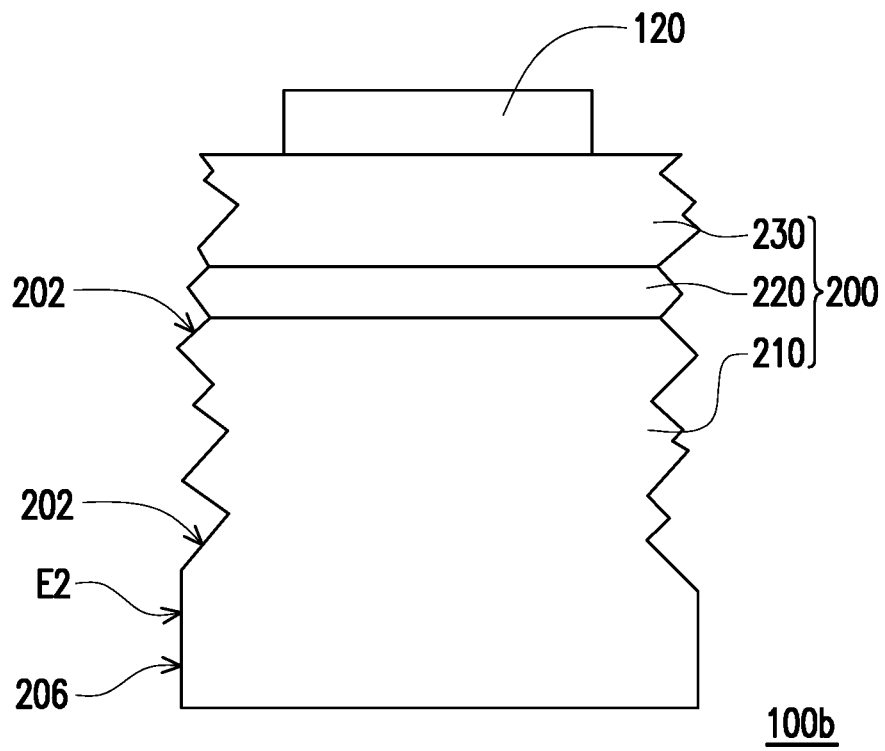
FIG. 7 is a schematic cross-sectional view of a light-emitting diode structure according to an embodiment of the disclosure.

Then, the first portion P1 of the semiconductor stack layer 200 is adhered onto a third substrate 410 with a patterned adhesive material 140. After that, as shown in FIG. 6B, the third substrate 410 is caused to move relative to the second substrate 310 in a direction away from each other to break the first portion P1 and the second portion P2 apart from each other. Accordingly, the formed first portion P1 (i.e., the light-emitting diode structure) has both the etched side walls E1 and E2, that is, has both the straight edges 204 and 206. In another embodiment, before the steps of FIG. 6A, it is also possible not to selectively etch a portion of the second type semiconductor layer 230 of the second portion P2. As such, the light-emitting diode structure formed after FIG. 6B has the etched side wall E2 but not the etched side wall E1, and has the straight edge 206 but not the straight edge 204, and the light-emitting diode structure is similar to the light-emitting diode structure as shown in FIG. 7.

Figure 8A:
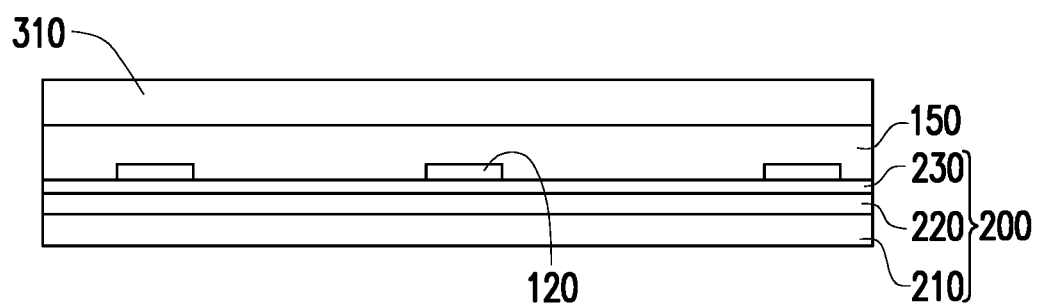
FIG. 8A to FIG. 8C are schematic cross-sectional views illustrating a manufacturing method of a light-emitting diode structure according to another embodiment of the disclosure.
Figure 8B:
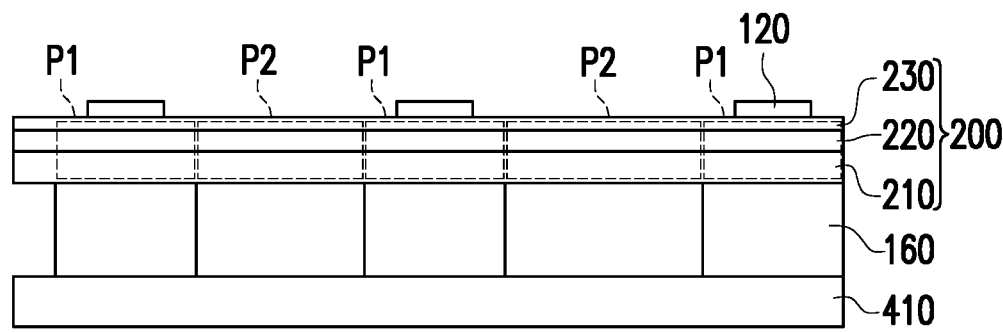
Figure 8C:
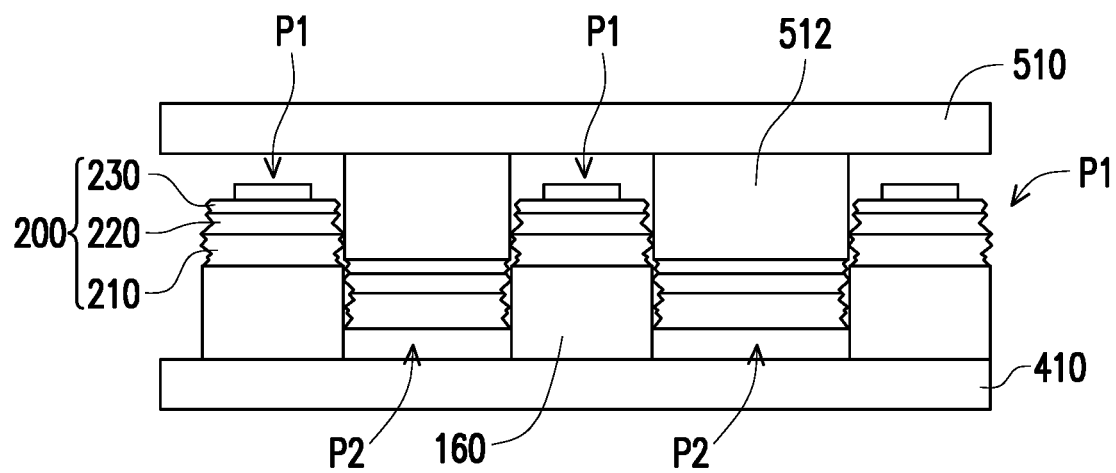

FIG. 8A to FIG. 8C are schematic cross-sectional views illustrating a manufacturing method of a light-emitting diode structure according to another embodiment of the disclosure. With reference to FIG. 8A to FIG. 8C, the manufacturing method of a light-emitting diode structure of this embodiment is similar to the manufacturing method of a light-emitting diode structure of FIG. 1A to FIG. 1D, and the differences between them are described as follows. In the manufacturing method of a light-emitting diode structure of this embodiment, the semiconductor stack layer 200 of FIG. 1A is first transferred from the first substrate 110 to the second substrate 310, as shown in FIG. 8A. Specifically, the second type semiconductor layer 230 and the electrode 120 may be adhered to the second substrate 310 with an adhesive material 150, and then the first substrate 110 may be removed. For example, the first substrate 110 is removed by a laser lift-off process. Next, as shown in FIG. 8B, the semiconductor stack layer 200 is adhered to the third substrate 410 with a patterned adhesive material 160, and the second substrate 310 is removed. In this embodiment, the first portion P1 of the semiconductor stack layer 200 is adhered to the third substrate 410 with the patterned adhesive material 160, for example. However, in another embodiment, the second portion P2 of the semiconductor stack layer 200 may also be adhered to the third substrate 410 with the patterned adhesive material 160.

After that, as shown in FIG. 8C, in this embodiment, the step of using a force applying means (e.g., a pulling force or a pressing force) to break the first portion P1 and the second portion P2 of the semiconductor stack layer 200 apart from each other includes the following. A force applying means is provided (e.g., by applying a pulling force or a pressing force) from the side of the semiconductor stack layer 200 away from the third substrate 410 to the semiconductor stack layer 200 to break the first portion P1 and the second portion P2 apart from each other. The force applying means is provided (e.g., by applying a pulling force or a pressing force) at a position staggered from the pattern of the patterned adhesive material 160. In this embodiment, it is possible to provide a patterned substrate 510 having a plurality of patterned protrusions 512 that are staggered from the pattern of the patterned adhesive material 160, and the step of FIG. 8C further includes providing a force applying means (e.g., by applying a pulling force or a pressing force) to the patterned protrusions 512. Alternatively, in another embodiment, the force applying means is applied (e.g., by applying a pulling force or a pressing force) to the semiconductor stack layer 200 by using liquid pressure. For example, in this embodiment, pressure may be applied to the second portion P2 by the patterned protrusions 512 of the patterned substrate 510, or pressure may be applied to the second portion P2 by using liquid pressure, to break the first portion P1 and the second portion P2 apart from each other. In this embodiment, the positions of patterned protrusions 512 correspond to the positions of the second portions P2. Therefore, the first portion P1 and the second portion P2 may be broken apart from each other by applying pressure to the second portion P2 by the patterned protrusions 512. In another embodiment, in a case where the second portion P2 of the semiconductor stack layer 200 is adhered to the third substrate 410 with the patterned adhesive material 160, the positions of the patterned protrusions 512 may correspond to the positions of the first portions P1. Moreover, the first portion P1 and the second portion P2 may be broken apart from each other by applying pressure to the first portion P1 by the patterned protrusions 512.

In this embodiment, the patterned protrusions 512 are integrally formed with the patterned substrate 510. However, in other embodiments, it is also possible that the patterned protrusions 512 are an adhesive material coated on the patterned substrate 510.

Figure 9A:
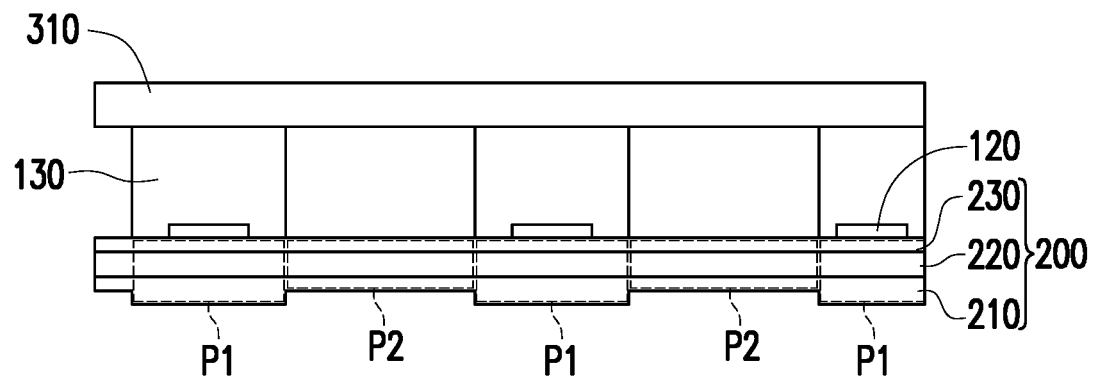
FIG. 9A to FIG. 9C are schematic cross-sectional views illustrating a manufacturing method of a light-emitting diode structure according to yet another embodiment of the disclosure.
Figure 9B:
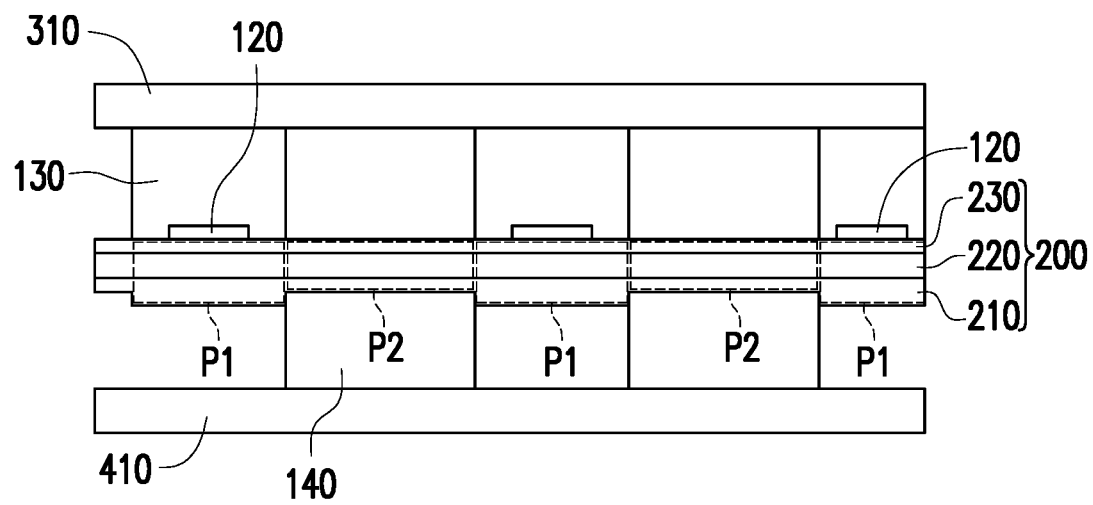
Figure 9C:
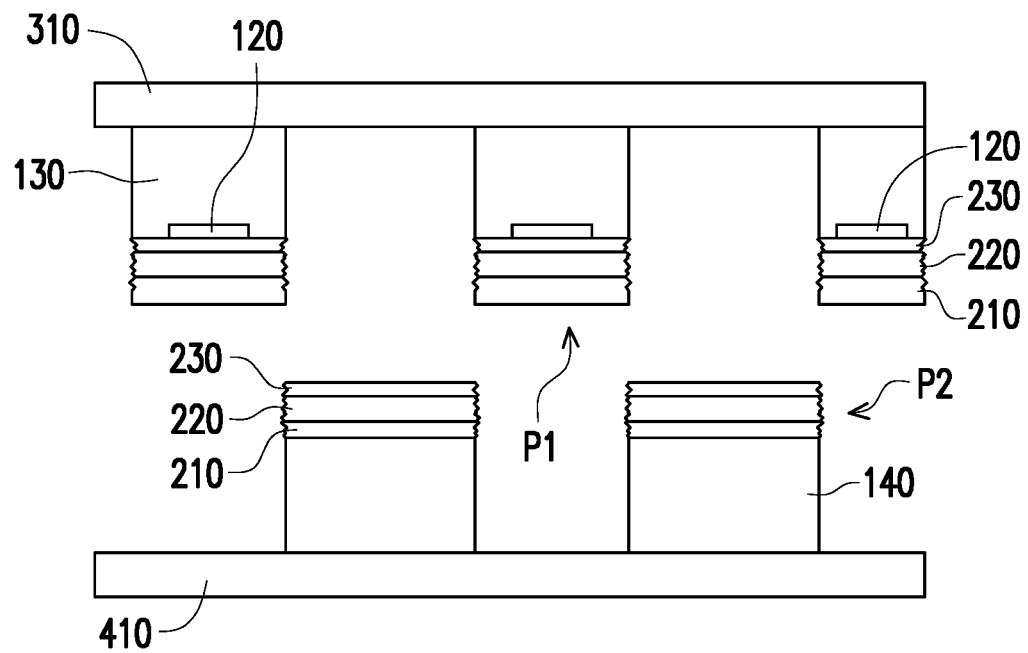

FIG. 9A to FIG. 9C are schematic cross-sectional views illustrating a manufacturing method of a light-emitting diode structure according to yet another embodiment of the disclosure. With reference to FIG. 9A to FIG. 9C, the manufacturing method of a light-emitting diode structure of this embodiment is similar to the manufacturing method of a light-emitting diode structure of FIG. 1A to FIG. 1D, and the differences between them are described as follows. In the manufacturing method of a light-emitting diode structure of this embodiment, first, as shown in FIG. 9A, the first portion P1 of the semiconductor stack layer 200 as shown in FIG. 1A is first adhered to the second substrate 310 with the patterned adhesive material 130. Then, the first substrate 110 as shown FIG. 1A is removed, for example, by a laser lift-off process.

Figure 10:
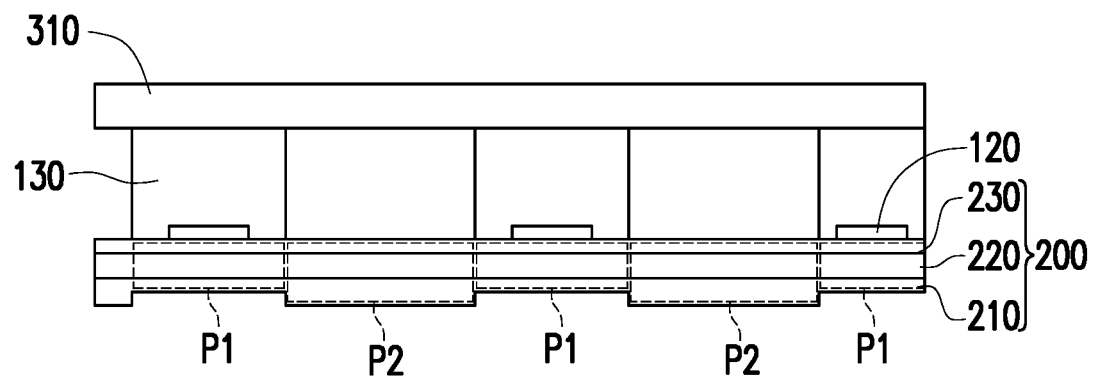
FIG. 10 is a schematic cross-sectional view illustrating another variation of a step of the manufacturing method of the light-emitting diode structure of FIG. 9A.

In this embodiment, at least one of a portion of the first type semiconductor layer 210 and a portion of the second type semiconductor layer 230 of the second portion P2 may first be selectively etched, and it is taken as an example in FIG. 9A that a portion of the first type semiconductor layer 210 of the second portion P2 is selectively etched, to form the etched side wall E2 and the straight edge 206 on the first portion P1. In a preferred embodiment, when the first portion P1 is adhered to the second substrate 310 as shown in FIG. 9A, a portion of the second type semiconductor layer 230 of the second portion P2 may also be etched. However, in other embodiments, it is also possible not to perform the step of selectively etching the second portion P2. Alternatively, in another embodiment, as shown in FIG. 10, at least one of a portion of the first type semiconductor layer 210 and a portion of the second type semiconductor layer 230 of the first portion P1 may also be first selectively etched, and it is taken as an example in FIG. 10 that a portion of the first type semiconductor layer 210 of the first portion P1 is first selectively etched.

Then, as shown in FIG. 9B, the second portion P2 is adhered to the third substrate 410 with the patterned adhesive material 140. Then, as shown in FIG. 9C, the second substrate 310 is caused to move relative to the third substrate 410 in a direction away from each other to break the first portion P1 and the second portion P2 apart from each other by a pulling force. Accordingly, the first portion P1 may form light-emitting diode structures.

In summary of the foregoing, in the light-emitting diode structure of the embodiments of the disclosure, the side wall at any side of the semiconductor stack layer includes a rough surface. In an embodiment, the side wall at any side of the semiconductor stack layer has the plurality of inclined edges on the longitudinal section perpendicular to the active layer, and the absolute value of the slope of each of the plurality of inclined edges relative to the active layer is less than 1.8. In other words, the side wall includes a portion that is not generated by etching. That is, the plurality of inclined edges are generated from breaking the semiconductor stack layer apart. Accordingly, the side wall effect caused by etching can be effectively prevented, so the non-radiative recombination of electrons and electron holes or current leakage in the light-emitting diode structure can be effectively suppressed, so that the luminous efficiency and brightness of the light-emitting diode structure can be effectively increased. In the manufacturing method of a light-emitting diode structure of the embodiments of the disclosure, a force applying means is provided (e.g., by applying a pulling force or a pressing force) to break the first portion and the second portion of the semiconductor stack layer apart from each other. The first portion includes the plurality of light-emitting diode structures separated from each other. Therefore, the side wall of the light-emitting diode structure includes a portion that is not generated by etching, that is, a portion that is generated from breaking apart. Accordingly, the side wall effect caused by etching can be effectively prevented, so the luminous efficiency and brightness of the light-emitting diode structure can be effectively increased.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a light-emitting diode structure, the method comprising:
   growing a semiconductor stack layer on a first substrate, wherein the semiconductor stack layer is divided into a first portion and a second portion, and comprises a first type semiconductor layer, an active layer, and a second type semiconductor layer sequentially grown on the first substrate;
   providing a force applying means to physically break the first portion and the second portion apart from each other, wherein the first portion comprises a plurality of light-emitting diode structures separated from each other; and
   before providing the force applying means to break the first portion and the second portion apart from each other, irradiating, by a laser, a boundary between the first portion and the first substrate or a boundary between the second portion and the first substrate to reduce a binding force between the first portion and the first substrate or reduce a binding force between the second portion and the first substrate.

2. The manufacturing method according to claim 1, wherein providing the force applying means comprises applying a pulling force or a pressing force.

3. The manufacturing method according to claim 1, wherein a side wall at any side at a break of the first portion has a plurality of inclined edges on a longitudinal section perpendicular to the active layer, an absolute value of a slope of each of the plurality of inclined edges relative to the active layer is less than 1.8, and the plurality of inclined edges have a plurality of different slopes.

4. The manufacturing method according to claim 3, wherein a root mean square roughness of the side wall at the break of the first portion is between 150 nm and 3 μm.

5. The manufacturing method according to claim 1, further comprising:
   before providing the force applying means to break the first portion and the second portion apart from each other, etching the first portion or the second portion to form an etched side wall on the semiconductor stack layer.

6. The manufacturing method according to claim 5, wherein the etched side wall is located on at least one of the first type semiconductor layer and the second type semiconductor layer, the etched side wall has a straight edge on a longitudinal section perpendicular to the active layer, and an absolute value of a slope of the straight edge relative to the active layer is greater than or equal to 3.

7. The manufacturing method according to claim 1, further comprising:
   before providing the force applying means to break the first portion and the second portion apart from each other, adhering the first portion or the second portion onto a second substrate with a patterned adhesive material, such that the semiconductor stack layer is located between the first substrate and the second substrate; and
   moving the second substrate relative to the first substrate in a direction away from or close to each other to separate the first portion and the second portion.

8. The manufacturing method according to claim 1, further comprising:
   before providing the force applying means to break the first portion and the second portion apart from each other, etching the first portion or the second portion, such that a longitudinal section area of the first portion and a longitudinal section area of the second portion are different from each other.

9. The manufacturing method according to claim 1, further comprising:
   before providing the force applying means to break the first portion and the second portion apart from each other, transferring the semiconductor stack layer from the first substrate to a second substrate;
   adhering the semiconductor stack layer onto a third substrate with a patterned adhesive material, and removing the second substrate; and
   applying the force applying means to the semiconductor stack layer from the side of the semiconductor stack layer away from the third substrate to break the first portion and the second portion apart from each other, wherein a position where the force applying means is applied is staggered from a pattern of the patterned adhesive material.

10. The manufacturing method according to claim 9, further comprising:
    providing a patterned substrate, wherein the patterned substrate has a plurality of patterned protrusions staggered from the pattern of the patterned adhesive material; and
    applying the force applying means to the patterned protrusions.

11. The manufacturing method according to claim 10, wherein the patterned protrusions are integrally formed with the patterned substrate, or the patterned protrusions are an adhesive material coated on the patterned substrate.

12. The manufacturing method according to claim 9, wherein the force applying means comprises applying a pressure to the semiconductor stack layer by using a liquid pressure.

* * * * *